United States Patent [19]
Lee et al.

[11] Patent Number: 5,994,924
[45] Date of Patent: Nov. 30, 1999

[54] CLOCK DISTRIBUTION NETWORK WITH DUAL WIRE ROUTING

[75] Inventors: Jin-Fuw Lee, Yorktown Heights; Daniel Lawrence Ostapko, Mahopac, both of N.Y.

[73] Assignee: International Business Machines Corporation, Armonk, N.Y.

[21] Appl. No.: 08/876,552

[22] Filed: Jun. 16, 1997

[51] Int. Cl.[6] .................................................. H03K 19/00
[52] U.S. Cl. ............................................. 326/93; 326/101
[58] Field of Search ................................. 326/21, 39, 93, 326/96, 98, 101

[56] References Cited

U.S. PATENT DOCUMENTS 5,896,055  4/1999  Toyonaga et al. .......................... 326/93

*Primary Examiner*—Jon Santamauro
*Assistant Examiner*—Don Phu Le
*Attorney, Agent, or Firm*—Whitham, Curtis & Whitham; Paul J. Otterstedt

[57] ABSTRACT

A new clock distribution network design for VLSI circuits which effectively reduces skew without the area and power penalty associated with prior clock designs. Two wires emanating from the clock in opposite directions or, alternatively, two wires connected in series and running parallel, are used to route clock signals from the clock source to the tapping point near the circuit component. Clock signals from the two wires are fed through two-input NOR gates (alternatively, two-input NAND gates) to the clock pins. The clock signal arrival time is roughly equal to the simultaneous switching gate delay plus the average arrival times from the two paths, which turns out approximately the same across different tapping points, thus minimizing clock skews. Narrow wires may be used for routing, resulting in moderate power consumption.

15 Claims, 8 Drawing Sheets

CLOCK DISTRIBUTION NETWORK WITH DUAL WIRE ROUTING

BACKGROUND OF THE INVENTION

1. Field of the Invention

The present invention generally relates to a clock distribution network design for high speed microprocessors and other very large scale integrated (VLSI) circuits and, more particularly, to a clock distribution network with dual clock lines to drive the clock network in a way that significantly reduces clock skew without paying a penalty of large wiring areas and consequently enormous power consumption.

2. Background Description

Integrated circuit manufacturing technology has made great advances in reducing the feature size on the one hand and enlarging the die size on the other hand. The increase of the chip size coupled with the requirement of faster clock period imposes the following challenging problem for the clock design: How can we design a clock network which properly synchronizes the latch operations on the different parts of a very large semiconductor integrated (VLSI) circuit chip? This requires that the clock skews, the difference of clock arrival times at clock pins, be reduced to some tolerable fraction of the cycle period.

A popular approach to the clock design problem in the literature is to generate a mesh structure clock network, as illustrated in FIG. 1. With a mesh structure comprising, in the example illustrated, a main clock line 11 and branching clock lines $12_1$ to $12_5$, the network can deliver clock signal to any latch designers might place on the chip. The connection to the clock pins of latches is through some inverter buffers $13_1$ to $13_8$. The inverter buffers are needed to drive several latches (not shown) in the same neighborhood.

As deep sub-micron technology emerges, signal delays over long narrow wires become more prominent, about 100 picoseconds (ps) for 5 millimeter (mm) line in today's complementary metal oxide semiconductor (CMOS) technology. Also, it is well known that narrow lines are more susceptible to process variations, which causes the minimum wire width to vary from one side of chip to the other. Therefore, in order to control the resulting skew problem, the clock wires in the mesh structure need to be fattened in the entire chip area. The fat wires will decrease the delay from the clock source to inverter buffers, and thus also reduce the skew. Digital Equipment Corporation's Alpha processor adopted this approach. The drawback is that these fat wires take a large area of the metal layer and also consume enormous power. A way to reduce skew without the area and power penalty becomes a major goal of high speed microprocessor design.

SUMMARY OF THE INVENTION

It is therefore an object of the invention to provide a new clock distribution network design for VLSI circuits which effectively reduces skew without the area and power penalty associated with prior clock designs.

According to the invention, two wires emanating from the clock in opposite directions are used to route clock signals from the clock source to the tapping point near the circuit component. Clock signals from the two wires are fed through two-input NOR gates (alternatively, two-input NAND gates) to the clock pins. The clock signal arrival time is roughly equal to the simultaneous switching gate delay plus the average arrival times from the two paths, which turns out approximately the same across different tapping points, thus minimizing clock skews. Narrow wires may be used for routing, resulting in moderate power consumption.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2A:
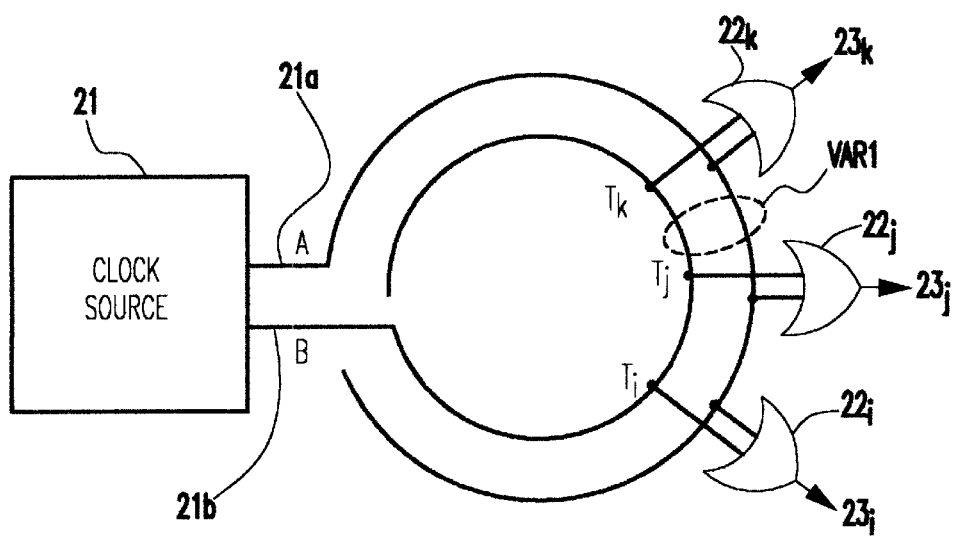
FIG. 2A is a diagram illustrating a basic clock distribution network using a symmetrically driven dual wire routing according to a first embodiment of the present invention.
Figure 2B:
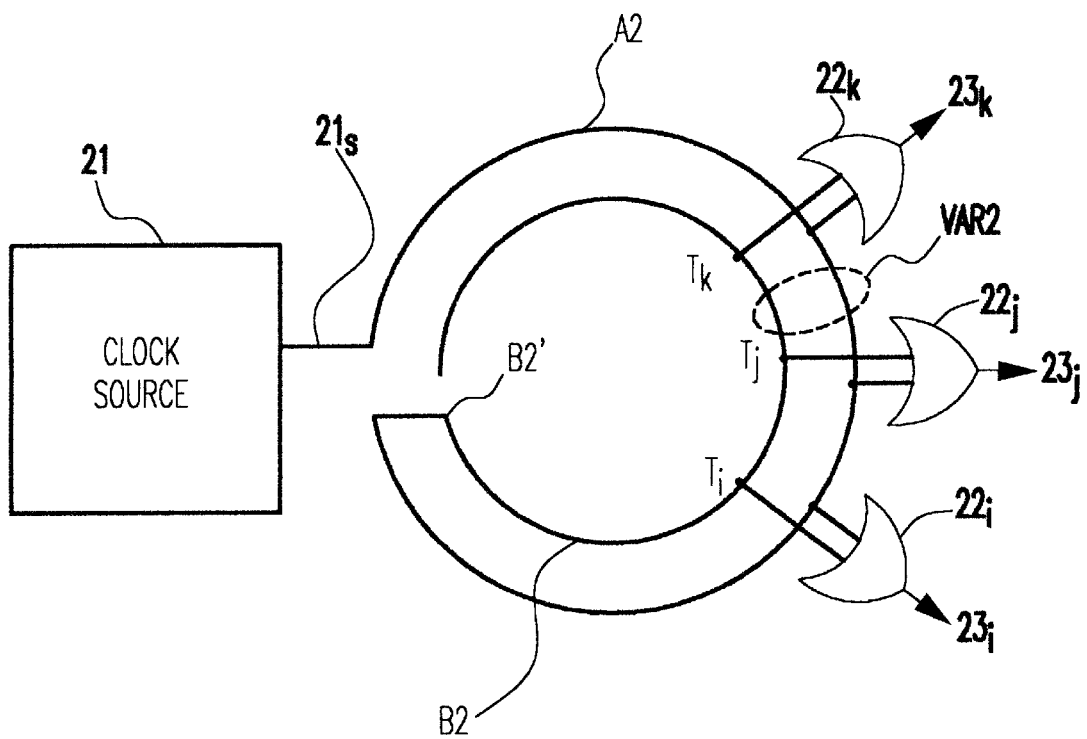
FIG. 2B is a diagram illustrating a basic clock distribution network using a singly driven dual wire routing according to another embodiment of the present invention.

Referring again to the drawings, and more particularly to FIGS. 2A and 2B, the new clock design structure according to the invention is shown. Two wires, A and B, or portions A2 and B2, emanating in the opposite directions, are used to route clock signals from the clock source 21 to a tapping point near circuit components. Clock signals from these two wires are fed through two input NOR gates $22_i$, $22_j$ and $22_k$ (alternatively, two input NAND gates) to the clock pins $23_i$, $23_j$ and $23_k$.

In a first embodiment of the invention, shown in FIG. 2A, both wire A and wire B are driven directly by the clock source 21 by terminals 21a and 21b, respectively. The FIG. 2A embodiment is referenced hereinafter as the symmetrically driven embodiment.

In a second embodiment of the invention, shown in FIG. 2B, a first wire portion A2 is connected directly to the terminal 21s of clock source 21, while the end of wire portion A2 distal from the clock source 21 is connected to a second wire portion B2 beginning at B2'. The FIG. 2B embodiment is referenced hereinafter as the singly driven embodiment.

For both the FIG. 2A and 2B example embodiments the length of each of wires A and B, and each of the wire portions A2 and B2, is L.

For the symmetrically driven embodiment of FIG. 2A, the clock signals from the clock source 21 appear simultaneously at terminals 21a ends 21b which are connected respectively to wires A and B. The paths from the clock source terminals 21a and 21b, through wires A and B, to a tapping point $T_i$ are $\rho1=AT_i$ and $\rho2=BT_i$, respectively. The corresponding path lengths are L1 and L2. The average path length to each of the tapping points $T_i$, $T_j$ and $T_k$ is (L1+L2)/2, which is equal to one half the length L,(the length of both wires A and B), regardless of which tapping point. In other words, the average path length is always L/2, independent of the position of the tapping point.

For the singly driven embodiment, the clock signal from terminal 21s will arrive at the first end B2' of wire portion B2 after the delay incurred through the entire length L of wire portion A2. The path from terminal 21s to the input of tapping point $T_i$ connected directly to wire portion A2 is $\rho1=AT_i$, while the path length from the terminal 21s to the input of tapping point $T_i$ connected directly to wire portion B2 is $\rho2=ABT_i$. The corresponding path lengths are PL1 and PL2. As for the first embodiment, the average of the PL1 and PL2 path lengths, (PL1+PL2)/2, is equal to the length L of the wire portions A2 and B2, regardless of the position of the tapping point.

As can be seen from the path length description above, and which will be explained in more detail below, the clock signal arrival time is approximately the same across different tapping points. Therefore, clock skew is minimized.

In this design, narrow wires may be used for the routing. Therefore, the power consumption is moderate, since the total wire length is only twice that of one single narrow wire routing.

The dual clock routing of this invention is also less susceptible to process variations. This is an important feature because, due to different conditions under which VLSI chips are manufactured, characteristics of wires, such as width, resistivity, and capacitance, may vary across the chip. For example, assume that a path through wires A and B, or wire portions A2 and B2, to two tapping points $T_i$ and $T_j$ is in a region of variation. The variation will be assumed to cause a difference $\Delta$ between the actual delay time and the nominal delay time. The invention's canceling of effects of the difference $\Delta$ will be discussed, first for the FIG. 2A embodiment and then for the FIG. 2B embodiment.

Referring first to FIG. 2A, assume that wires A and B pass through a region of process variation, labeled as VAR1, which adds an additional delay $\Delta$ to the clock. Therefore, at tapping point $T_i$ the actual arrival time through wire A differs from the nominal time by $\Delta$. However, at tapping point $T_j$, wire B has not yet passed through VAR1. Therefore the actual arrival time at tapping point $T_i$ through wire B is equal to the nominal time. The change in the average arrival time is therefore $\Delta/2$. On the other hand, at tapping point $T_k$ wire A has not yet passed through the region VAR1, although wire B has. Therefore, the actual arrival time through wire B to the tapping point $T_k$ is delayed by $\Delta$, while the arrival time through wire A is unchanged. The change in the average arrival time at tapping point $T_k$ is therefore, again, $\Delta/2$. The change in average arrival time of $\Delta/2$ holds true for all of the tapping points because, for each, exactly one of the two wires A and B passes through the region of process variation. Therefore, the skew from tapping point to tapping point caused by process variations cancels to zero.

Referring to FIG. 2B, assume a process variation at the location labeled VAR2. The variation adds an additional delay $\Delta$ to the clock. At tapping point $T_i$ the actual arrival time through wire portion A2 differs from the nominal time by $\Delta$. After the clock passes through wire portion B2 and again reaches tapping point $T_i$ the delay of $\Delta$ remains. Therefore, tapping point $T_i$ sees the clock delayed by $\Delta$ at wire portions A2 and B2. The average delay is therefore $\Delta$. At tapping point $T_k$, however, the clock on wire portion A2 is not delayed because wire portion A2 has not passed through VAR2. However, the clock on wire portion B2 has been delayed twice, to an amount $2\times\Delta$, by the time it reaches tapping point $T_k$ because the path, meaning the remainder of wire portion A2 and B2, has crossed region VAR2 twice. The average delay is therefore, again, $\Delta$. The change of $\Delta/2$ holds true for all of the tapping points because, for each, the path through wire portions A2 and B2 passes through the region of process variation twice. Therefore, the skew from tapping point to tapping point caused by process variations cancels to zero.

Figure 1:
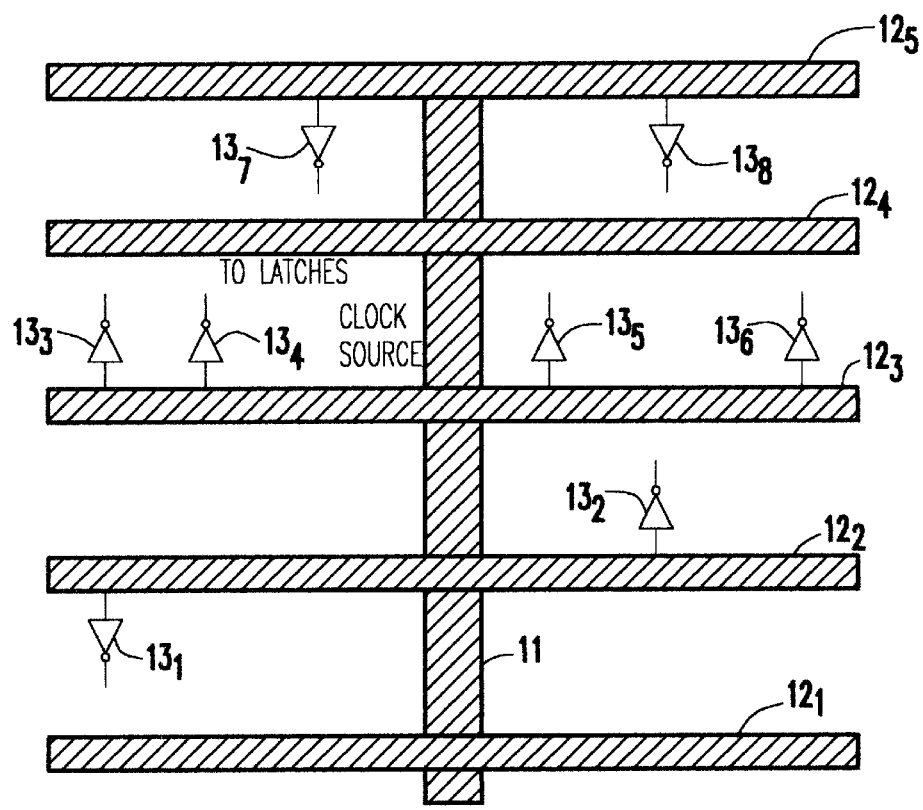
FIG. 1 is an illustration of a conventional mesh structure clock network.

Referring back to FIG. 1, it is readily apparent that the clock arrival time at tapping points before and after a region of variation VAR3 changes by zero and $\Delta$, respectively. The skew is therefore is equal to $\Delta$. Accordingly, it is easily seen that when skew arising from process variations is a concern that the dual wire clock of the present invention is better than single wiring.

Figure 3A:
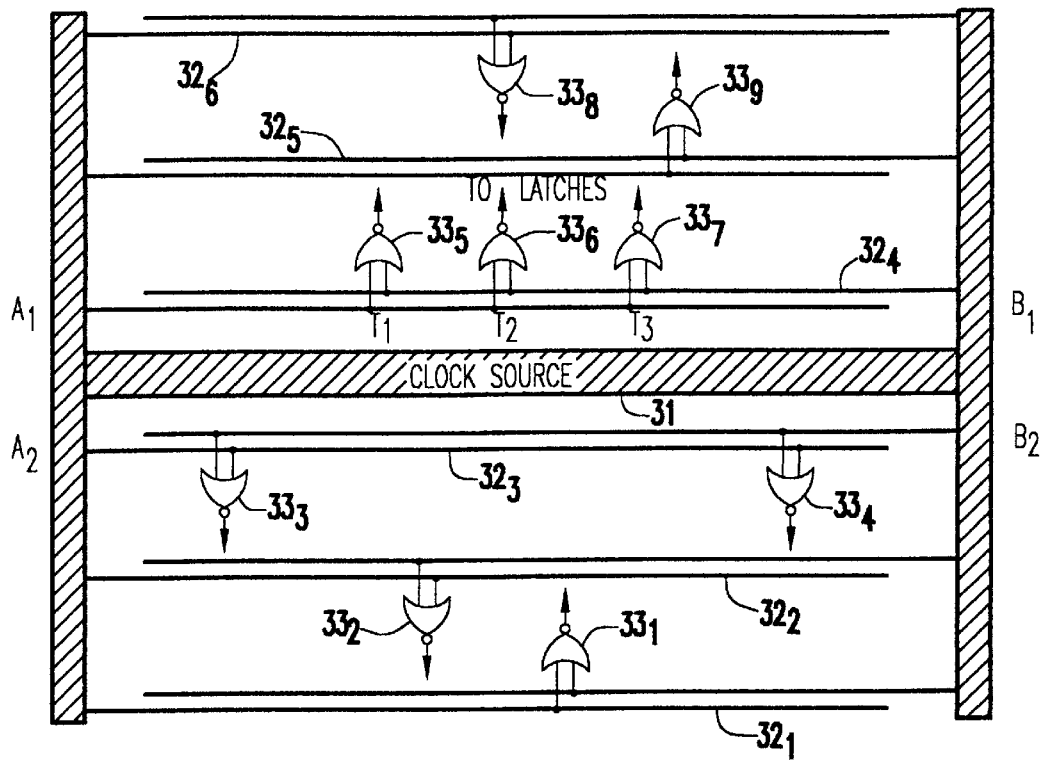
FIG. 3A is an illustration of a first way to use the new clock design of the FIG. 2A embodiment of the invention which combines a backbone of fat wires with branches of symmetrically driven dual clock lines.

One possible way to apply this style of design to the clock network is to combine a backbone of fat wires with branches of narrow dual clock lines. As illustrated in FIG. 3A, the backbone may be an H-tree, as described by S. Dhar, M. A. Franklin and D. F. Wann in "Reduction of clock delays in VLSI structures", *Proceedings ICCD*, pp. 778–783, October 1984, with a center trunk 31 and two side banks A and B. Fat wires are used in the backbone to keep delays to a minimum amount. Pairs of narrow clock wires $32_1$ to $32_6$, the wires of each pair branching out from an opposite bank of the backbone, run parallel to each other in opposite directions. At each taping point, $T_j$, the two clock signals on the pair of wires are sent via a two-input NOR (or NAND) gates $33_1$ to $33_9$ to the clock pins.

Figure 3B:
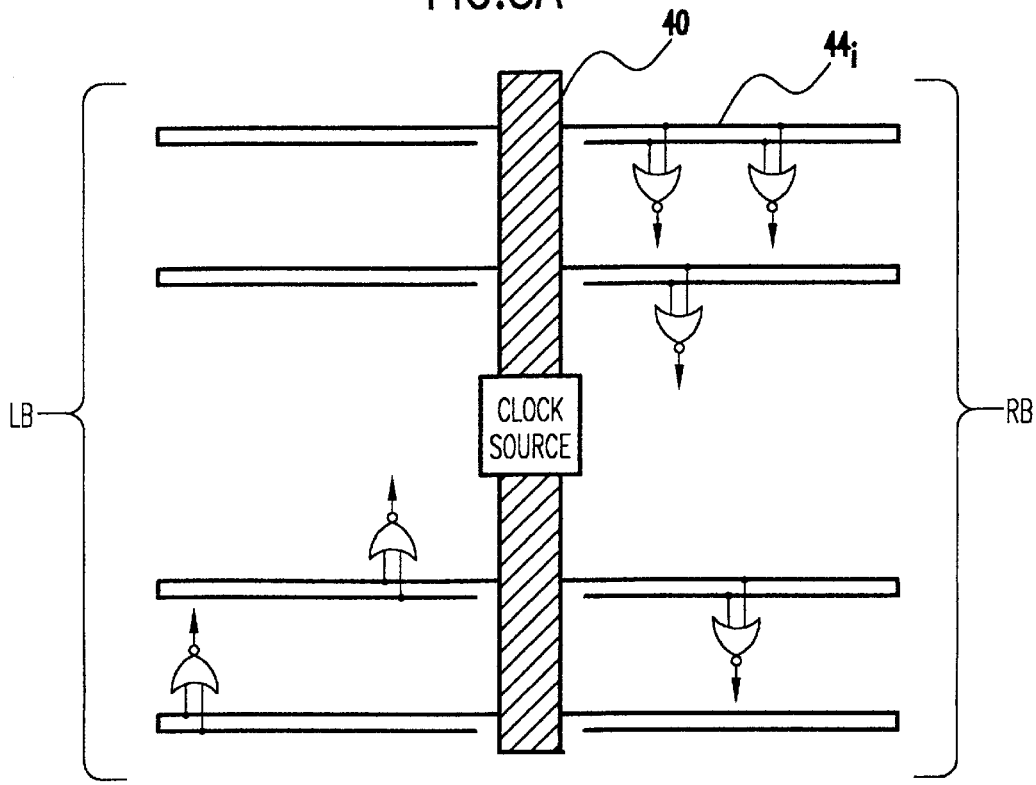
FIG. 3B is an illustration of a first way to use the new clock design of the FIG. 2B embodiment of the invention which combines a backbone of fat wires with branches of singly driven dual clock lines.

For a second example, as illustrated in FIG. 3B, the backbone consisting of a fat center trunk 40 distributes the clock signals in the y-direction. The fat trunk 40 drives a left and right bank LB and RB of single wires looped to have pairs of parallel lengths $44_i$ In both the clock structure of FIGS. 3A and 3B, the power consumption is moderate, since fat wires are few, and the total length of narrow clock lines is only twice that of a single clock line.

Figure 4A:
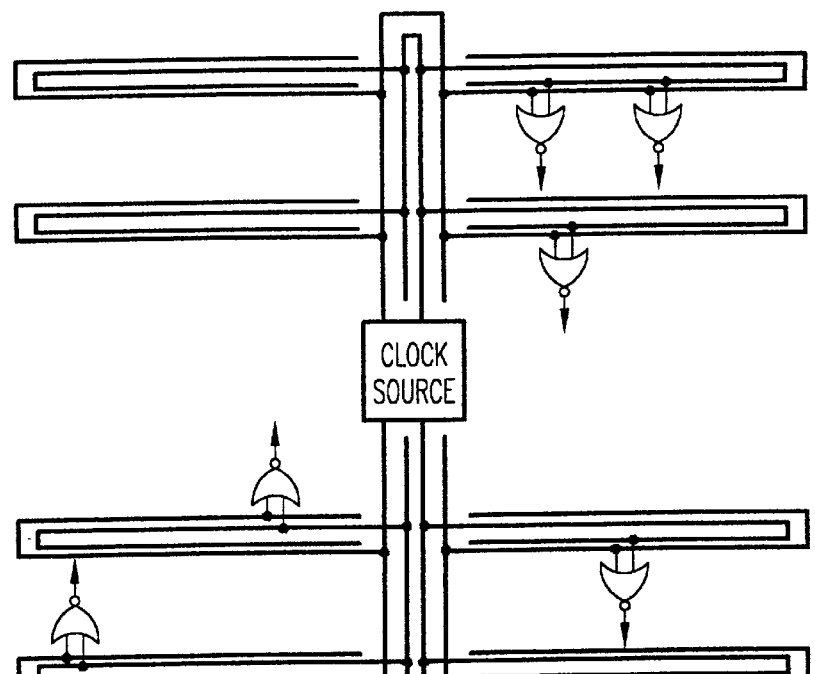
FIG. 4A is an illustration of a second way to use the new clock design of the FIG. 2A embodiment of the invention in which the symmetrically driven dual clock lines are laid out interstitially.
Figure 4B:
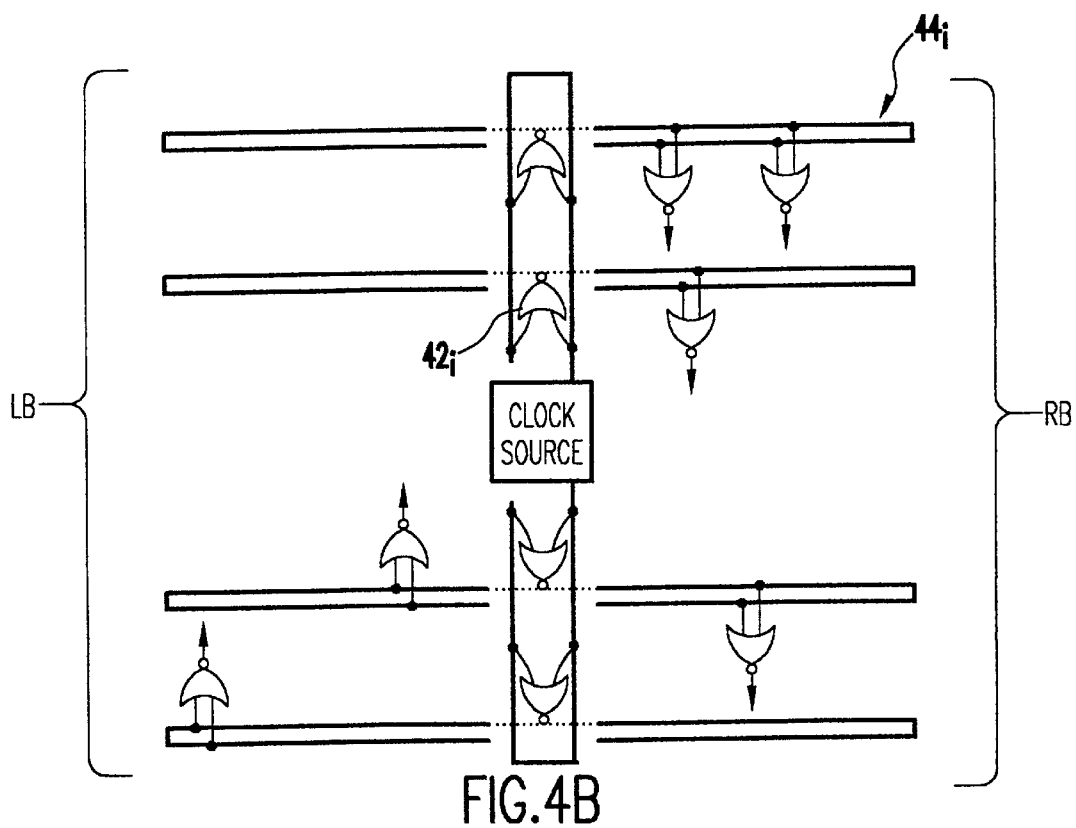
FIG. 4B is an illustration of a second way to use the new clock design of the of the FIG. 2B embodiment of the invention in which the singly driven dual clock lines are laid out interstitially.

Another possible way to apply this style of design to the clock network is to use narrow dual wires in both X and Y directions, as shown in FIGS. 4A and 4B.

In the example shown by FIG. 4A symmetrically driven dual wires are routed interstitially. The power consumption increases moderately since the total length of narrow clock wires is about four times that of a single clock line.

In the example shown by FIG. 4B, singly driven dual clock routing is first used in the Y direction. Clocks are distributed through that routing by NAN2(NOR2) gates $42_i$ as clock drivers each singly driving a left and right bank LB and RB of single wires looped to have pairs of parallel lengths $44_i$. Each branch is accomplished by the singly driven dual clock routing. The total length of narrow clock wires is one half of that in the FIG. 4A.

In the following analysis of clock signals, it is assumed that the delay on the backbone is negligible since it is formed of fat wires. As clock signals propagate through these narrow wires, skews may be generated. However, the skew of clock signals at the output of NOR or NAND gates will be significantly reduced. To demonstrate the effectiveness of skew reduction, we perform the following two simulation runs. The first circuit is a pair of narrow wires driving three NOR gates spaced equally. The second circuit is a single narrow wire driving three inverters spaced equally.

Figure 5A:
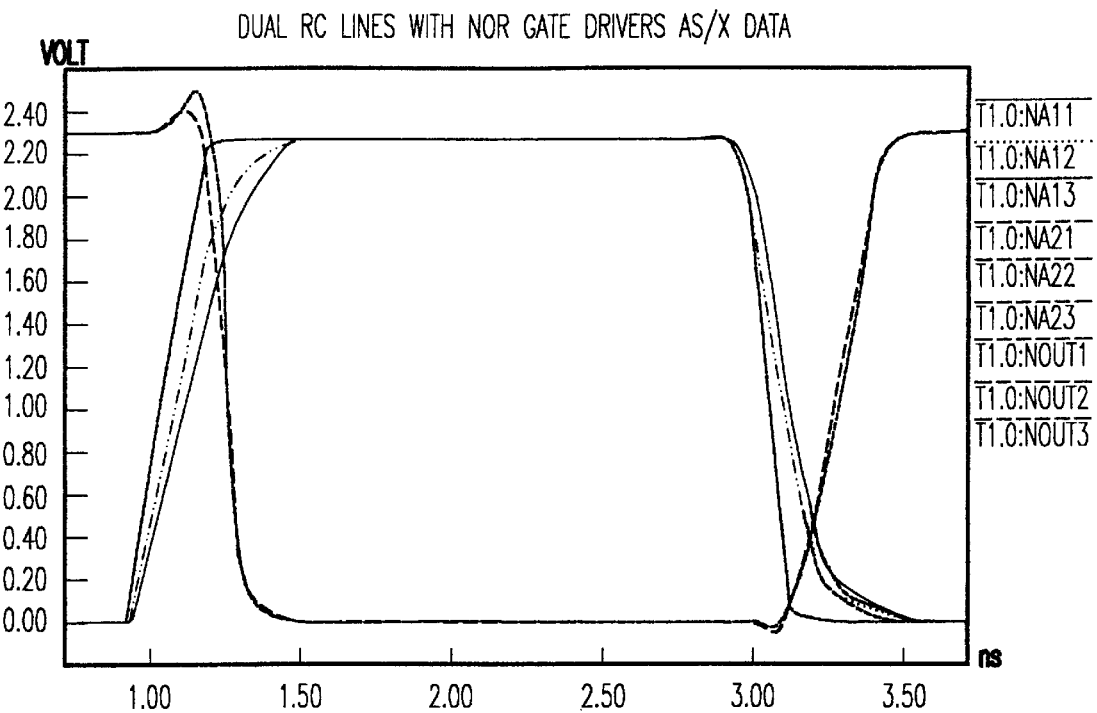
FIG. 5A is a graph showing the timing response of line signals and NOR gate output at three positions for dual lines with NOR gate drivers.

The circuit was simulated using the Advanced Statistical analysis Program (ASTAP) extended (AS/X). The AS/X wave forms of the first circuit are shown in FIG. 5A. NA11, NA12 and NA13 denote the wave forms at three tapping points on wire A. NA21, NA22 and NA23 denote the wave forms at three tapping points on wire B. The output wave forms of three NOR gates, NOUT1, NOUT2 and NOUT3, are packed tightly together, which indicates a skew much smaller than that of tapping points on either wires.

Figure 5B:
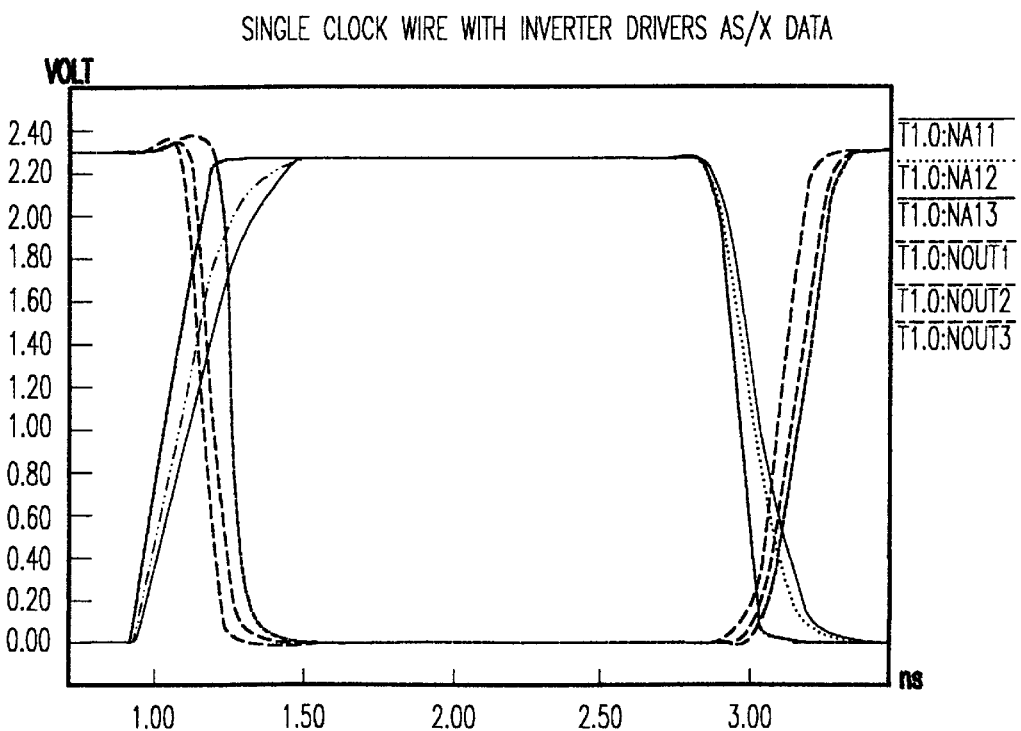
FIG. 5B is a graph showing the timing response of line signals and inverter output at three positions for a single clock wire with inverter drivers.

For comparison, the AS/X wave forms of the second circuit are shown in FIG. 5B. The skew in the inverter output wave forms, NOUT1, NOUT2 and NOUT3, is about the same as that in waveforms, NAl1, NA12 and NAl3, of the clock wire.

Analysis

Figure 6A:
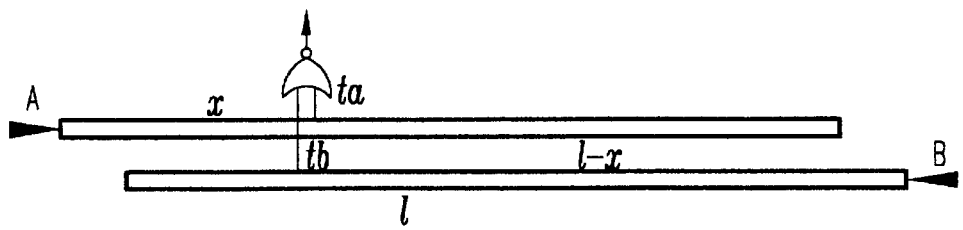
FIG. 6A is a schematic diagram showing dual clock lines and a NOR gate driver.
Figure 7:
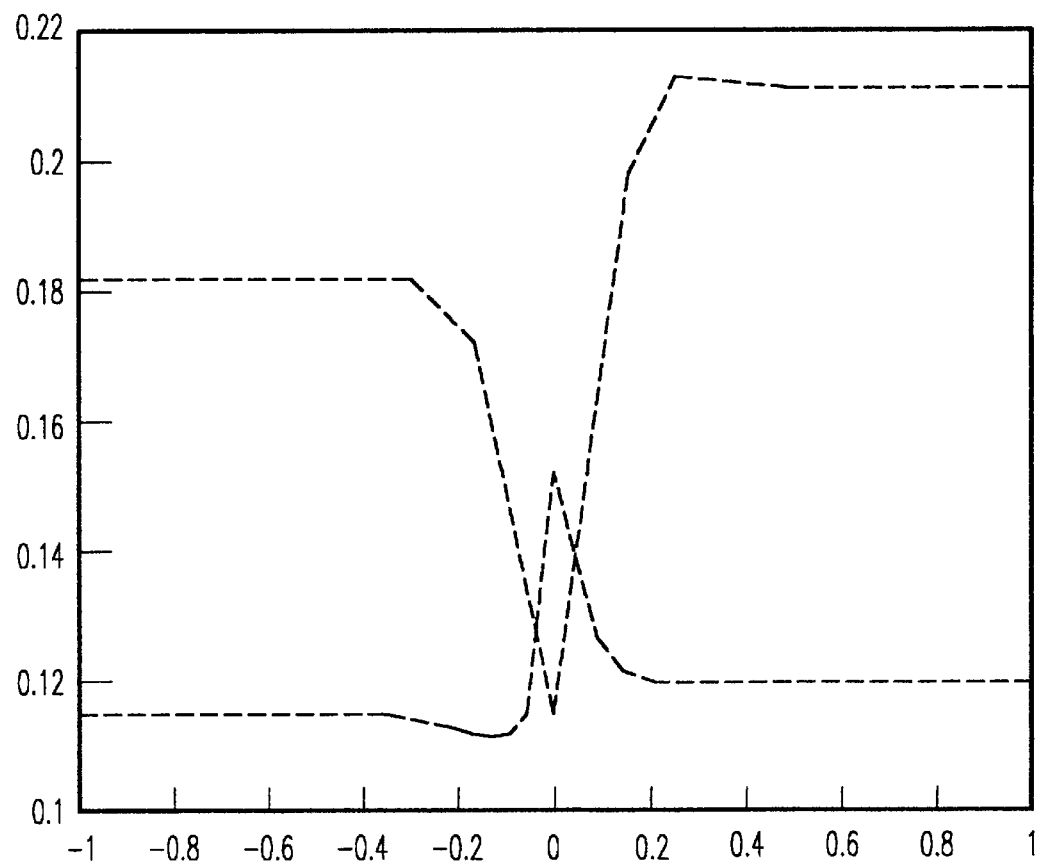
FIG. 7 is a graph showing the gate delay for the output falling and rising transitions of a NOR gate as a function of the difference between input signal arrival times.

Next, we will show in general that the skew of clock signals at the output of NOR or NAND gates is reduced. The signal delay through the narrow clock lines consists of two terms: the resistance/capacitance (RC) delay and the time-of-flight delay. The pair of narrow clock wires can be modeled as transmission lines shown in FIG. 6A. Assume that the length of lines A and B is l, and distances traveled to taping point T, via lines A and B are x and l-x, respectively. Let us denote the signal arrival times at $T_i$ via lines A and B be $ta_i$ and $tb_i$, respectively. If the difference in the arrival times is small, we need to consider the effect of simultaneous switching delay on clock signals through the NOR gate. The delay plotted as a function of $ta_i-tb_i$ is shown in FIG. 7. The delay curves in FIG. 7 may be approximated within some range around the origin by piece-wise linear curves: $d_f+|ta_i-tb_i|/2$ for the falling delay (upper) curve and $d_r-|ta_i-tb_i|/2$ for the rising delay (lower) curve. See T. M. Burks, J. F. Lee and D. L. Ostapko, "Method to Analyze Worst-Case Simultaneous Switching Delay", *IBM Technical Disclosure Bulletin*, Vol. 40, No. 3, March 1997, pp. 33–41. Here $d_f$ and $d_r$ denote simultaneous switching delay for the output falling and rising transition respectively. Within the linear range, the falling and rising signal arrival time at gate output will be $$t_i(\text{falling transition}) = \min(ta_i, tb_i) + \frac{|ta_i - tb_i|}{2} + d_f \quad (1)$$

$$= \frac{ta_i + tb_i}{2} + d_f$$

$$t_i(\text{rising transition}) = \max(ta_i, tb_i) - \frac{|ta_i - tb_i|}{2} + d_r$$

$$= \frac{ta_i + tb_i}{2} + d_r$$

for a two-input NOR gate. We also noted that the linear range for the falling delay curve is larger than that of the rising delay curve. Empirically from AS/X simulation of a two-input NOR gate under various input slews and output loadings, we found that $$\text{range (falling transition)} \approx 0.5 \times T_x$$

$$\text{range (rising transition)} \approx 0.2 \times T_x \quad (2)$$

where $T_x$ is the slew present at the input pins of the NOR gate.

A CMOS two-input NAND gate is a dual circuit of a two-input NOR gate. It also exhibits similar delay curves for the simultaneous switching effect, except that the falling and rising transitions change role.

Therefore, Equations (1) and (2) are changed to $$t_i(\text{falling transition}) = \max(ta_i, tb_i) - \frac{|ta_i - tb_i|}{2} + d_f \quad (3)$$

$$= \frac{ta_i + tb_i}{2} + d_f$$

$$t_i(\text{rising transition}) = \min(ta_i, tb_i) + \frac{|ta_i - tb_i|}{2} + d_r$$

$$\frac{ta_i + tb_i}{2} + d_r$$

$$\text{range (falling transition)} \simeq 0.2 \times T_x$$

$$\text{range (rising transition)} \simeq 0.5 \times T_x$$

When $|ta_i-tb_i|$ is far away from the linear range around the origin, then one of $ta_i$ and $tb_i$ dominates, and the delay curve approaches the single pin switching delay. The skew in clock signal arrival time at the output of the NOR gate in this case is the same as that from one clock wire switching. If the average, $(ta_i+tb_i)/2$ is nearly constant across different taping points, in order to achieve minimum clock skew at outputs of NOR gates, we need to keep $ta_i-tb_i$ either within the linear region of the delay curve or its vicinity.

Next we shall discuss three situations: lossless transmission lines, pure RC delay lines, and typical metal lines in current CMOS processes.

Lossless Transmission Lines

For lossless lines, the sheet resistance is zero. Let the sheet capacitance and inductance per unit length be C and L respectively. Then the time-of-flight delay is proportional to the distance the signal travels: the signal arrival times are $ta_i=x/v$ and $tb_i=(l-x)/v$, where $v=1/\sqrt{LC}$ is the propagation speed, about 0.15 mm/ps (half the speed of light) for metal lines on CMOS chips. Therefore, $\tau=l/v$ is the skew on either line A or B. The average arrival time is independent of the locations of tapping points, while the arrival time difference varies linearly with x:

$$\frac{ta_i + tb_i}{2} = \frac{\tau}{2} \quad (4)$$

$$ta_i - tb_i = \left(\frac{2x}{l} - 1\right)\tau$$

where $\tau = l/v$.

For a 15 mm line, the skew $\tau$ is about 15/0.15=100 ps, and $ta_i - tb_i \cong (x/l - 0.5)$ 200 ps. If the clock input slew is set to 200 ps, the linear ranges for the rising and falling transitions are 40 ps and 100 ps, respectively, from Equation (2). The arrival time difference $tb_i - ta_i$ will reach the limit of linear range for the rising and falling transitions at $|x/l - 0.5| \cong 0.2$ and 0.5, respectively. In other words, a flat horizontal line is expected for $t_i$ in the range $0.3 < x/l < 0.7$ for the rising transition, and the whole range of $x/l$ for the falling transition.

Figure 8A:
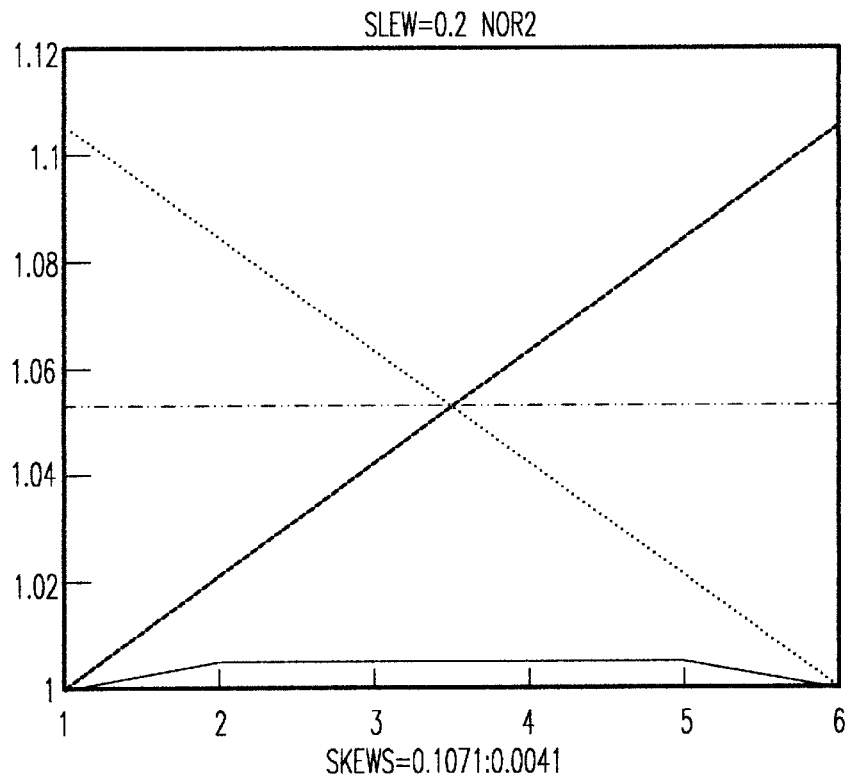
FIG. 8A is a graph illustrating the arrival times of a lossless wire for a falling pulse.
Figure 8B:
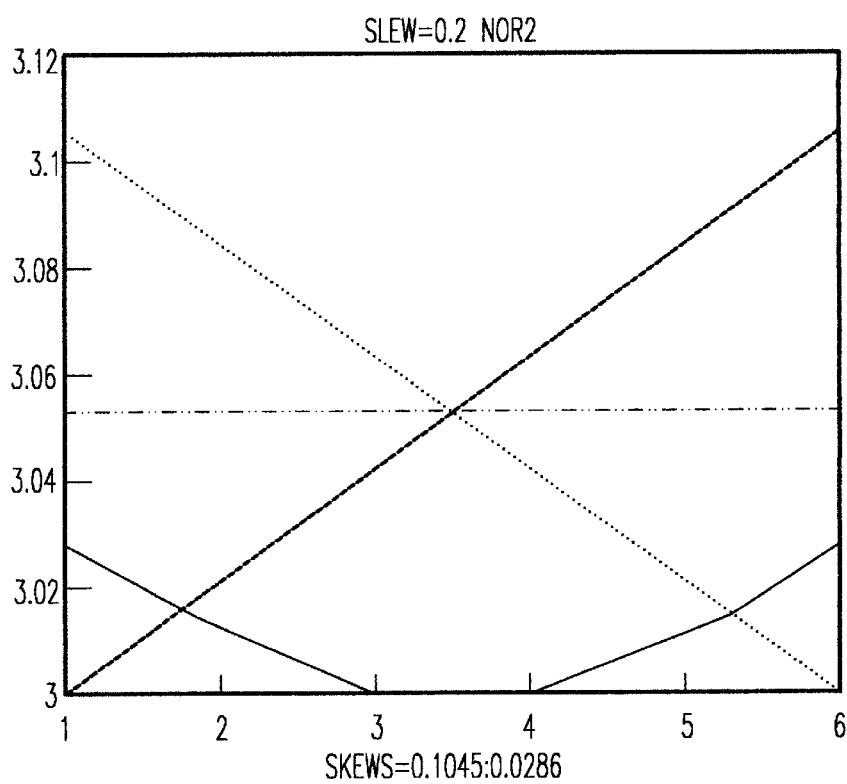
FIG. 8B is a graph illustrating the arrival times of a lossless wire for a rising pulse.

To verify these, we ran simulations on a pair of 15 mm lossless lines with six NOR tapping gates evenly distributed. A resistor of size $\sqrt{LC}$ is added to terminate the line after the last gate. This is needed to eliminate the reflections from the line end. The arrival times $ta_i$, $tb_i$, and $t_i$, plotted against I are shown in FIGS. 8A and 8B as dash, dot, and solid curves, respectively. In FIGS. 8A and 8B (and also in FIGS. 9A and 9B), the curves of $ta_i$, $tb_i$ and $t_i$ are shifted vertically so that the bottoms of the curves touch the horizontal axis. After the shift, the height of the maximum point on the arrival time curve represents the corresponding skew. FIG. 8A shows the arrival times for the falling transitions on the NOR gate output. The skew in $\{t_i\}$ is only about 4 ps, compared to 107 ps skew in either line A or B. FIG. 8B shows the arrival times for the rising transitions on the NOR output pin. The skew in $\{t_i\}$ is only about 29 ps, compared to 105 ps skew in either line A or B.

Pure RC Lines

Figure 6B:
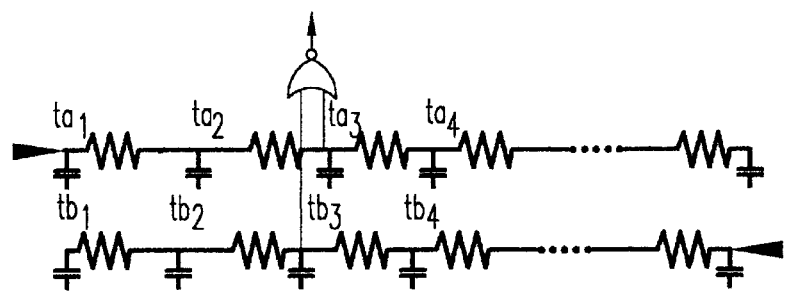
FIG. 6B is a schematic diagram of the equivalent Elmore model of the circuit shown in FIG. 6A.

For pure RC lines, the inductance is zero. Let the sheet capacitance and resistance per unit length be C and R respectively. The delay at taping points along a RC line can be approximated by Elmore delay model. See W. C. Elmore, "The transient response of damped linear networks with particular regard to wide-band amplifier", *J. Applied Physics*, Vol. 19, no. 1, pp. 55–63, January 1948. Let us chop a RC line of length l into n segments of equal length, say $\Delta x = l/n$, as shown in FIG. 6B. The resistance and capacitance of each segment are given by $R\Delta x$ and $C\Delta x$. Using the Elmore delay model, the delay on the segment from node $ta_1$ to node $ta_2$ is the product of the segment resistance with the sum of capacitances to its right: $R\Delta x \times C\Delta x$ n. The accumulated signal delay at the end of segment I is the sum of delays from $a_1$ to $a_{i+1}$.

$$ta_i = R\Delta \times C\Delta \times (n + (n-1) + \ldots (n-i+1)) \quad (5)$$

$$= R\Delta \times C\Delta \times (n + n - i + 1)\frac{i}{2}$$

$$ta(x) = RC(2l - x)\frac{x}{2}$$

where $x = i\Delta x$ and $l = n\Delta x$.

Similarly, at the distance x from the left of $b_i$ on wire B, the accumulated delay can be obtained by substituting x with $l - x$: $tb(x) = RC(l+x)(l-x)/2$. Both $ta_i$ and $tb_i$ are quadratic functions of l. The skew from one line end to the other is $\tau = RCl^2/2$. Rewriting the arrival times in terms of $\tau$ gives:

$$ta(x) = \tau\left(\frac{2x}{l} - \frac{x^2}{l^2}\right) \quad (6)$$

$$tb(x) = \tau\left(1 - \frac{x^2}{l^2}\right)$$

$$\frac{ta(x) + tb(x)}{2} = \tau\left(\frac{1}{2} + \frac{x}{l} - \frac{x^2}{l^2}\right)$$

$$ta(x) - tb(x) = \tau\left(\frac{2x}{l} - 1\right)$$

The average arrival time $(ta_i + tb_i)/2$, reaching the maximum $0.75\tau$ at the mid-point ($x = l/2$), and the minimum $0.5\tau$ at line ends $x = 0, l$, has a skew $0.25\tau$, while the difference $ta_i - tb_i$ varies linearly with x.

As the clock signals propagate along RC lines, the wave forms change shape. See FIGS. 5A and 5B. No matter what slew is set initially at the clock source, simulation shows that the slew of the wave form will fast converge to the characteristic value: $T_x \cong 2\tau$, which from Equation (2) gives rise to $0.4\tau$ and $\tau$ for the linear ranges of the rising and the falling transitions, respectively. The arrival time difference $tb_i - ta_i$ will reach the limits of linear range for the rising and falling transitions at $|x/l - 0.5| \cong 0.2$ and 0.5, respectively. In other words, $t_i$ is expected to follow the curve $(ta_i + tb_i)/2$ in the range $0.3 < x/l < 0.7$ for the rising transition, and the whole range for the falling transition.

Figure 9A:
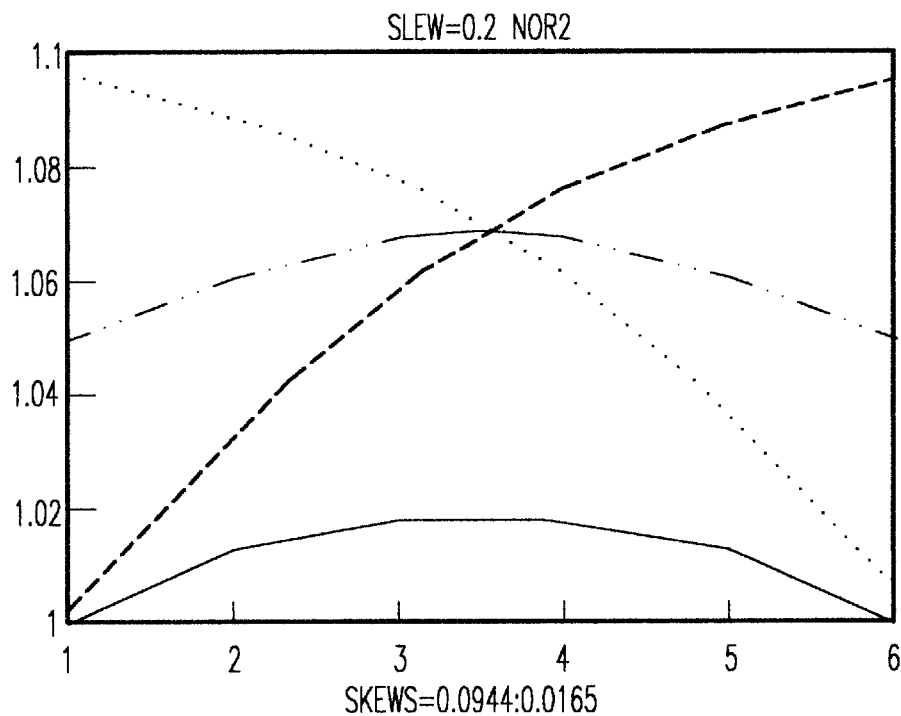
FIG. 9A is a graph illustrating the characteristics of a pure RC wire for a falling pulse.
Figure 9B:
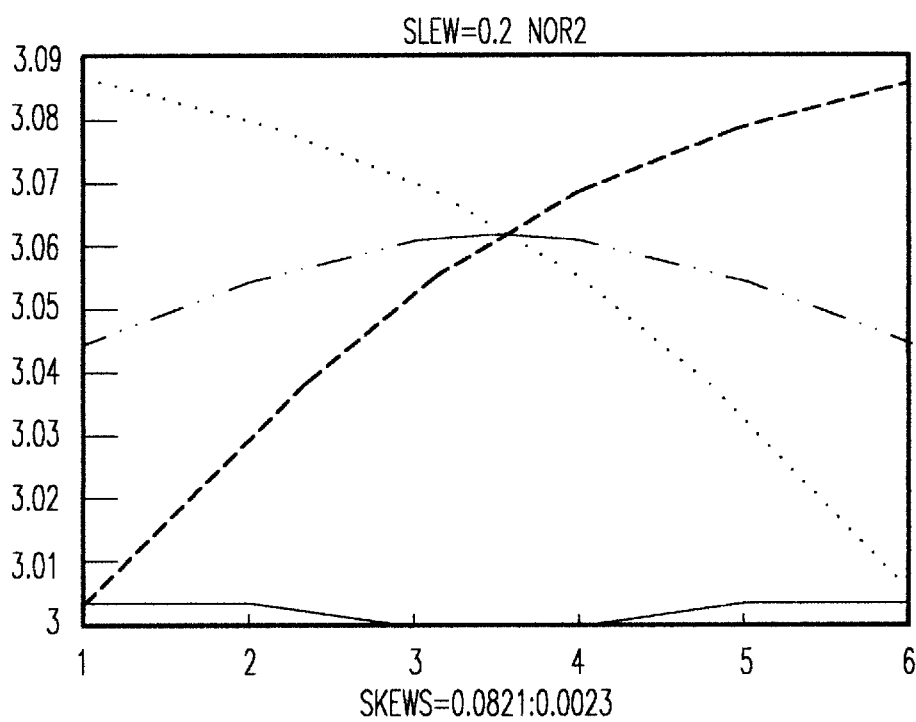
FIG. 9B is a graph illustrating the characteristics of a pure RC wire for a rising pulse.

FIGS. 9A and 9B show the simulation results on a pair of RC lines with six tapping gates evenly distributed. The length of the line is chosen such that $\tau \cong 100$ ps. The arrival times, $ta_i$, $tb_i$, $(ta_i + tb_i)/2$ and $t_i$ for a pure RC line are plotted in FIGS. 9A and 9B as dash, dot, dot-dash and solid curve, respectively. The skew in $\{t_i\}$ is only about 17 ps, compared to 94 ps skew in either line A or B. FIG. 9B shows the arrival times for the rising transitions on the two input NOR output pin. The skew in $\{t_i\}$ is only about 2 ps, compared to 82 ps skew in either line A or B. For the falling transition, the linear range of simultaneous switching covers the entire wire range. Therefore, $t_i$ has approximately the same shape and skew as $(ta_i + tb_i)/2$. For the rising transition, the linear range of simultaneous switching is $|x/l - 0.5| < 0.2$. We expect that $t_i$ has the same shape as $(ta_i + tb_i)/2$ only within this region. When $|ta_i - tb_i|$ are far away from the region, say, $|x/l - 0.5| > 0.4$, $t_i$ should approach the shape of $\max(ta_i, tb_i)$. The smooth transition between these two regions produce a flatter curve for $t_i$, which has skew less than that of falling transition.

CMOS Metal Lines

For the current CMOS6S process technology, the typical value for the sheet resistivity of metal layers is 0.05 $\Omega$/square for M2 to M4, and 0.015 $\Omega$/square for LM. If the high value, 0.05 $\Omega$/square is used, for a narrow wire of width 1.0 $\mu$m, this corresponds to R=50 $\Omega$/mm. The sheet capacitance of metal layers is about C=0.2 ff/$\mu$m=0.2 pf/mm. The RC delay along a 5 mm long narrow wire is about $\tau_R = RCl^2/2 = 125$ ps, while the time-of-flight delay is $\tau_L = \sqrt{LC}l = l/v = 5/150 = 0.033$ ns=33 ps. Therefore, the RC delay is the dominated term. If the low value, 0.015 $\Omega$/square of resistivity is used, $\tau_R = RCl^2/2 = 38$ ps which is comparable to $\tau_L = 33$ ps. These numbers would change slightly, since the gates present will add extra capacitance. The effect of self inductance is determined by the ratio $\rho = R/(L2\pi/Tx) = RCTx/2\pi LC = \tau_R Tx/\pi\tau_L^2$. If the skew of the clock source is set to $Tx = 200$ ps, $\rho$ is approximately 7 and 2 for resistivity value 0.05 $\Omega$/square and 0.015 $\Omega$/square, respectively.

Experimental results from AS/X simulation on a pair of clock lines driving six NOR gates are summarized in Table 1. The transistor sizes, 20 μm for n-channel field effect transistors (NFETs) and 80 μm for p-channel field effect transistors (PFETs), are used to drive capacitance load of 0.25 pf. AS/X runs are done with four different lengths of clock line and two resistivity values. No line terminator was used in these AS/X runs. The same experiment was repeated for a pair of clock lines driving six NAND gates instead. The result are summarized in Table 2. Here transistor size, 20 μm, is used for both NFETs and PFETs in order to drive a load of 0.25 pf:

TABLE 1

Clock Skews in ns (NOR)

| sheet resistivity (ohm/sq) | length (cm) | falling wire skew | transition gate skew | rising wire skew | transition gate skew |
| --- | --- | --- | --- | --- | --- |
| 0.0500 | 0.2500 | 0.0871 | 0.0183 | 0.0703 | 0.0025 |
| 0.0500 | 0.5000 | 0.1992 | 0.0801 | 0.1609 | 0.0162 |
| 0.0500 | 0.7500 | 0.3161 | 0.1730 | 0.2084 | 0.0277 |
| 0.0500 | 1.0000 | 0.4364 | 0.2674 | 0.3461 | 0.0389 |
| 0.0150 | 0.2500 | 0.0289 | 0.0042 | 0.0242 | 0.0012 |
| 0.0150 | 0.5000 | 0.0748 | 0.0149 | 0.0669 | 0.0021 |
| 0.0150 | 0.7500 | 0.1304 | 0.0392 | 0.1218 | 0.0068 |
| 0.0150 | 1.0000 | 0.1922 | 0.815 | 0.1891 | 0.0189 |

TABLE 2

Clock skews in ns (NAND)

| sheet resistivity (ohm/sq) | length (cm) | falling wire skew | transition gate skew | rising wire skew | transition gate skew |
| --- | --- | --- | --- | --- | --- |
| 0.0500 | 0.2500 | 0.0500 | 0.0013 | 0.0516 | 0.0100 |
| 0.0500 | 0.5000 | 0.1315 | 0.0129 | 0.1364 | 0.0440 |
| 0.0500 | 0.7500 | 0.2349 | 0.0298 | 0.2039 | 0.0839 |
| 0.0500 | 1.0000 | 0.3532 | 0.0506 | 0.2972 | 0.1486 |
| 0.0150 | 0.2500 | 0.0169 | 0.0009 | 0.0176 | 0.0027 |
| 0.0150 | 0.5000 | 0.0501 | 0.0013 | 0.0532 | 0.0110 |
| 0.0150 | 0.7500 | 0.0959 | 0.0067 | 0.1034 | 0.0292 |
| 0.0150 | 1.0000 | 0.1473 | 0.0153 | 0.1622 | 0.0641 |

Conclusion

The use of dual clock lines to drive the clock network through either two-input NAND or NOR gates will reduce the clock skew significantly. The design is also less susceptible to process variation. The power consumption is modest, in the same order as that of a traditional clock tree using narrow wires.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A clock distribution network for very large scale integrated (VLSI) circuits comprising:

a clock source generating a clock signal;

two wires emanating from the clock source carrying signals in opposite directions and in close proximity used to route clock signals from the clock source to tapping points near circuit components; and a two-input logic gate at each tapping point, each input being connected to a respective one of the two wires, clock signals from the two wires being fed through the two-input logic gates at each tapping point to clock pins, the clock signal arrival time at the clock pins being roughly equal, minimizing clock skews.

2. The clock distribution network recited in claim 1 wherein the logic gates are NOR gates.

3. The clock distribution network recited in claim 1 wherein the logic gates are NAND gates.

4. The clock distribution network recited in claim 1 wherein narrow wires are used for clock signal routing, resulting in moderate power consumption.

5. The clock distribution network recited in claim 4 further comprising a backbone of fat wires with branches of narrow dual clock lines.

6. The clock distribution network recited in claim 5 wherein the backbone of fat wires in the shape of an H-tree with a center trunk and two side banks, the branches of narrow dual clock lines emanating from the two side banks.

7. The clock distribution network recited in claim 4 wherein said two wires are formed interstitially.

8. The clock distribution network recited in claim 7 wherein the interstitial wires are laid out in an X-Y grid.

9. A clock distribution network for very large scale integrated (VLSI) circuits comprising:

a clock source generating a clock signal;

first propagating means for receiving and propagating the clock signal, comprising:
      a first wire emanating from the clock source and carrying signals in a first direction, and
      a second wire proximate to said first wire and carrying signals in a direction opposite said first direction and connected to an end of the first wire distal from the clock source;

a plurality of tapping points, each including a two-input logic gate having a first input connected to the first wire of said first propagating means and a second input connected to the second wire of said first propagating means, for generating a gated clock output for input to a corresponding clock pin, said first propagating means first wire and second wire and said plurality of tapping points arranged so that, for each of said tapping points, a sum of a propagation distance from the clock source through the first wire to the first input of said tapping point and a propagation distance from said first input to the second input of said tapping point through said first and second wires is equal to a constant value, whereby the gated clock outputs of said plurality of tapping points are substantially simultaneous with respect to one another, thereby minimizing clock skews.

10. The clock distribution network recited in claim 9 wherein the logic gates are NOR gates.

11. The clock distribution network recited in claim 9 wherein the logic gates are NAND gates.

12. The clock distribution network recited in claim 9 wherein narrow wires are used for said first and second wires, resulting in moderate power consumption.

13. The clock distribution network recited in claim 9 comprising a second propagating means for receiving and propagating the clock signal, said second propagating means comprising:

a third wire emanating from an output of said two-input logic gate as a clock driver source, and a fourth wire connected to an end of the third wire distal from the clock driver source.

14. The clock distribution network recited in claim 13 further comprising a backbone of fat wires with a plurality of branches connected thereto, a first branch of said plurality of branch including said first propagating means and a second branch of said plurality of branches including said second propagating means, said branches being formed of narrow wires.

15. A clock distribution network for very large scale integrated (VLSI) circuit comprising:

a clock source generating a clock signal;

routing means for routing the clock signals from the clock source in opposite directions;

two wires emanating from the routing means to receive, propagate and carry signals in opposite directions in close proximity to one another for routing clock signals to tapping points near circuit components; and a two-input logic gate at each tapping point, each point being connected to a respective one of the two wires, clock signals from the two wires being fed through the two-input logic gates at each tapping point to clock pins, the clock signal arrival time at the clock pins being roughly equal, minimizing clock skews.

* * * * *